(12) United States Patent
Nam et al.

(10) Patent No.: US 10,199,469 B2
(45) Date of Patent: Feb. 5, 2019

(54) SEMICONDUCTOR DEVICE INCLUDING METAL-SEMICONDUCTOR JUNCTION

(71) Applicant: Samsung Electronics Co., Ltd., Suwon-si, Gyeonggi-do (KR)

(72) Inventors: Seunggeol Nam, Suwon-si (KR); Hyeonjin Shin, Suwon-si (KR); Yeonchoo Cho, Seongnam-si (KR); Minhyun Lee, Yongin-si (KR); Changhyun Kim, Seoul (KR); Seongjun Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1 day.

(21) Appl. No.: 15/439,031

(22) Filed: Feb. 22, 2017

(65) Prior Publication Data

US 2018/0047818 A1 Feb. 15, 2018

(30) Foreign Application Priority Data

Aug. 9, 2016 (KR) .................. 10-2016-0101225

(51) Int. Cl.
*H01L 29/66* (2006.01)
*H01L 29/40* (2006.01)
(Continued)

(52) U.S. Cl.
CPC .......... *H01L 29/408* (2013.01); *H01L 21/283* (2013.01); *H01L 29/41725* (2013.01);
(Continued)

(58) Field of Classification Search
CPC . H01L 27/28; H01L 27/283; H01L 29/66568; H01L 21/823425; H01L 21/76892; H01L 51/105
See application file for complete search history.

(56) References Cited

U.S. PATENT DOCUMENTS

| 9,331,217 B2 | 5/2016 | Rinzler et al. |
| 2003/0222012 A1* | 12/2003 | Lee ..................... B01D 61/142 |
| | | 210/321.84 |

(Continued)

FOREIGN PATENT DOCUMENTS

| JP | 2006226922 A | 8/2006 |
| JP | 2009218244 A | 9/2009 |

(Continued)

OTHER PUBLICATIONS

Lin, et al. "Shifting Schottky barrier heights with ultra-thin dielectric layers," Mircoetectric Engineering, vol. 88, pp. 1461-1463 (2011).

*Primary Examiner* — Jesse Y Miyoshi
*Assistant Examiner* — John Lin
(74) *Attorney, Agent, or Firm* — Harness, Dickey & Pierce, P.L.C.

(57) ABSTRACT

A semiconductor device includes a silicon semiconductor layer including at least one region doped with a first conductive type dopant, a metal material layer electrically connected to the doped region, and a self-assembled monolayer (SAM) between the doped region and the metal material layer, the SAM forming a molecular dipole on an interface of the silicon semiconductor layer in a direction of reducing a Schottky barrier height (SBH).

20 Claims, 9 Drawing Sheets

(51) Int. Cl.
*H01L 29/78* (2006.01)
*H01L 21/283* (2006.01)
*H01L 29/417* (2006.01)
*H01L 29/45* (2006.01)
*H01L 29/786* (2006.01)

(52) U.S. Cl.
CPC ...... *H01L 29/456* (2013.01); *H01L 29/66568* (2013.01); *H01L 29/78* (2013.01); *H01L 29/786* (2013.01); *H01L 29/7839* (2013.01)

(56) References Cited

U.S. PATENT DOCUMENTS

| | | | |
|---|---|---|---|
| 2007/0190800 A1* | 8/2007 | Rantala | C23C 16/401 438/758 |
| 2011/0031481 A1 | 2/2011 | Von Wrochem et al. | |
| 2012/0003485 A1* | 1/2012 | Habich | H01L 51/5088 428/447 |
| 2016/0027928 A1 | 1/2016 | Sato | |
| 2016/0049370 A1* | 2/2016 | Kamineni | H01L 21/76831 257/741 |

FOREIGN PATENT DOCUMENTS

| KR | 20110009060 A | 1/2011 |
|---|---|---|
| KR | 20130086930 A | 8/2013 |

* cited by examiner (electron withdrawing)

(electron donating)

FIG. 6B increasing electron donating ability →

— R

— Ar

— CH=CH$_2$

—NH-C(=O)—R

—O-C(=O)—R

— NH$_2$

— NR$_2$

— OH

— OR

— SH

| Alkyl | Carboxamido | Primary amine |
| Aromatic (phenyl) | Carboxyl | Tertiary amine |
| alkenyl | | Hydroxyl |
| | | Alkoxy |
| | | sulfhydryl |

SEMICONDUCTOR DEVICE INCLUDING METAL-SEMICONDUCTOR JUNCTION

CROSS-REFERENCE TO RELATED APPLICATION

This application claims the benefit of Korean Patent Application No. 10-2016-0101225, filed on Aug. 9, 2016, in the Korean Intellectual Property Office, the disclosure of which is incorporated herein in its entirety by reference.

BACKGROUND

1. Field

Some example embodiments relate to semiconductor devices including a metal-semiconductor junction.

2. Description of the Related Art

A semiconductor device includes a metal-semiconductor junction on a specific region of the semiconductor device in order to exchange electrical signals with an external device. A metal has a lower resistance than that of a semiconductor. The metal is readily wired to the external environment.

Due to the reduction in node size according to semiconductor integration, the resistance of a semiconductor channel is reduced, and thus, a parasitic resistance in addition to the channel resistance is the main cause for reducing an on-current. Contact resistance that accounts for a majority of the parasitic resistance is generated from a metal/semiconductor junction present in a source/drain. Control of the Schottky barrier height is difficult due to the pinning effect between a metal and a semiconductor, and thus, contact resistance is generated.

In order to reduce contact resistance, various methods of reducing a Schottky energy barrier between a metal and a semiconductor have been proposed. For example, a metal having a work function of about 4 eV has been used for an n-type semiconductor, and a metal having a work function of about 4 eV has been used for a p-type semiconductor. However, due to a pinning phenomenon in the work function of the metal on a surface of the semiconductor, there is a limit in reducing the Schottky energy barrier regardless of the type of metal.

As another method, a method of forming silicide on an interface of a metal/semiconductor or a method of inserting an insulator between a metal and a semiconductor has been conducted. However, in the method of forming silicide, there is a limit in the thermal stability of the dopant, and, in the method of inserting an insulator, there is a technical limit in uniformly depositing an insulating film having a thickness of about 1 nm or less.

SUMMARY

Some example embodiments provide semiconductor devices having a metal-semiconductor junction configured to reduce contact resistance by reducing a Schottky energy barrier using a molecular dipole.

Additional aspects will be set forth in part in the description which follows and, in part, will be apparent from the description, or may be learned by practice of example embodiments.

According to example embodiments, a semiconductor device includes a silicon semiconductor layer including at least one region doped with a first conductive type dopant, a metal material layer electrically connected to the doped region, and a self-assembled monolayer (SAM) between the doped region and the metal material layer, the SAM forming a molecular dipole on an interface of the silicon semiconductor layer in a direction of reducing a Schottky barrier height.

The SAM may form a positive molecular dipole or a negative molecular dipole on the interface of the silicon semiconductor layer.

The doped region may be doped with an n-type dopant, and the SAM may include a material forming the positive molecular dipole on a side of the interface of the silicon semiconductor layer.

The doped region may be doped with a p-type dopant, and the SAM may include a material forming the negative molecular dipole on a side of the interface of the silicon semiconductor layer.

The SAM may include a self-assembled monolayer material having a structure as represented below:

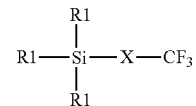

wherein,
each R1 includes one of $OCH_3$, $OC_2H_5$, and Cl,
X is one of a benzene ring and $(CH_2)n$, and
n is equal to or greater than 1.

The SAM may include a self-assembled monolayer material having a structure as represented below:

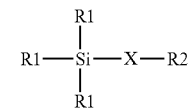

wherein,
each R1 includes one of $OCH_3$, $OC_2H_5$, and Cl,
R2 is a terminal group,
X is one of a benzene ring and $(CH_2)n$, and
n is equal to or greater than 1.

The doped region may be doped with an n-type dopant, and the terminal group R2 may include one of trifluoro, nitrile, sulfo, nitro, ammonium, carbonyl, ester, carboxamido, fluoro, chloro, and bromo.

The doped region may be doped with a p-type dopant, and the terminal group R2 may include one of primary amine, tertiary amine, hydroxyl, alkoxy, sulfhydryl, carboxamido, carboxyl, alkyl, phenyl, and alkenyl.

The SAM may have a thickness of about 0.1 nm or greater and about 1 nm or less.

The metal material layer may include at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, and an alloy thereof.

According to example embodiments, a semiconductor device includes a silicon semiconductor layer including source and drain regions doped with a first conductive type dopant, a metal material layer electrically connected to the source and drain regions, the metal material layer including a source electrode and a drain electrode, and first and second self-assembled monolayers (SAMs) between the respective source and drain regions and the respective source and drain electrodes, the first and second SAMs forming a molecular dipole on an interface of the silicon semiconductor layer in a direction of reducing an Schottky barrier height (SBH).

The first and second SAMs may form a positive molecular dipole or a negative molecular dipole on the interface of the silicon semiconductor layer.

The source and drain regions may be doped with an n-type dopant, and the first and second SAMs may include a material forming the positive molecular dipole on a side of the interface of the silicon semiconductor layer.

The source and drain regions may be doped with a p-type dopant, and the first and second SAMs may include a material forming the negative molecular dipole on a side of the interface of the silicon semiconductor layer.

The first and second SAMs may include a self-assembled monolayer material having a structure as represented below:

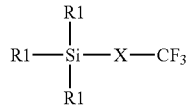

wherein, each R1 includes one of $OCH_3$, $OC_2H_5$, and Cl,

X is one of a benzene ring and $(CH_2)n$, and n is equal to or greater than 1.

The first and second SAMs may include a self-assembled monolayer material having a structure as represented below:

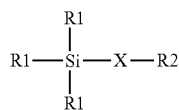

wherein, each R1 includes one of $OCH_3$, $OC_2H_5$, and Cl,

R2 is a terminal group,

X is one of a benzene ring and $(CH_2)n$, and n is equal to or greater than 1.

The source and drain regions may be doped with an n-type dopant, and the terminal group R2 may include one of trifluoro, nitrile, sulfo, nitro, ammonium, carbonyl, ester, carboxamido, fluoro, chloro, and bromo.

The source and drain regions may be doped with a p-type dopant, and the terminal group R2 may include one of primary amine, tertiary amine, hydroxyl, alkoxy, sulfhydryl, carboxamido, carboxyl, alkyl, phenyl, and alkenyl.

The first and second SAMs may have a thickness of about 0.1 nm or greater and about 1 nm or less.

The metal material layer may include at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, and an alloy thereof.

BRIEF DESCRIPTION OF THE DRAWINGS

These and/or other aspects will become apparent and more readily appreciated from the following description of the embodiments, taken in conjunction with the accompanying drawings in which:

FIG. 6B shows various examples of terminal groups of SAM materials that make a combination of FIG. 2 by being applied to a self-assembled monolayer of a semiconductor device according to example embodiments and form a negative molecular dipole on an interface of a silicon semiconductor layer;

DETAILED DESCRIPTION

Figure 1:
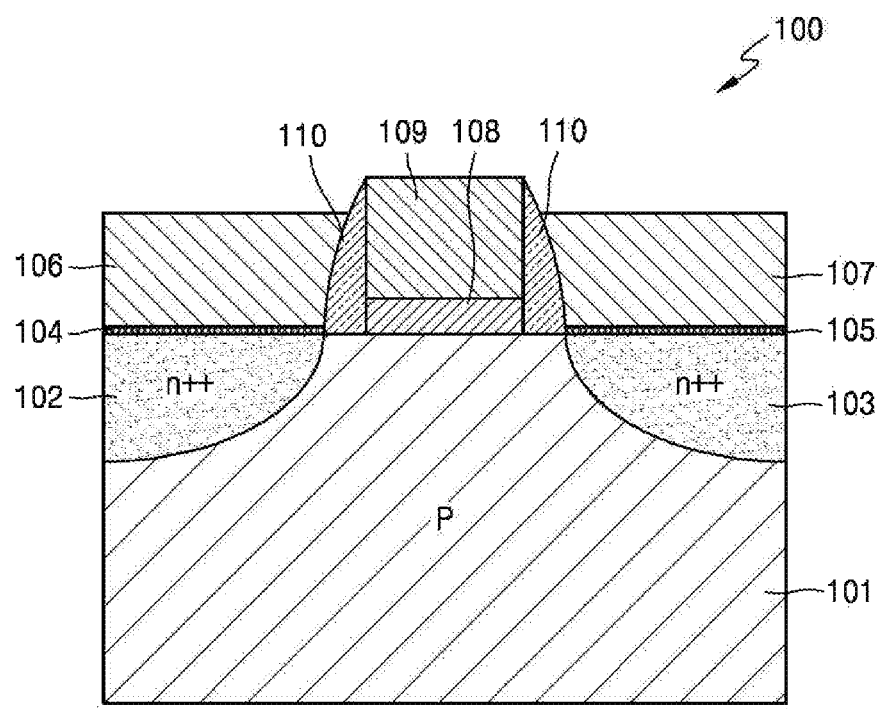
FIG. 1 is a schematic cross-sectional view of a structure of a semiconductor device according to example embodiments.

Embodiments of semiconductor devices having a metal-semiconductor junction will now be described in detail with reference to the accompanying drawings. In the drawings, like reference numerals refer to like elements throughout and sizes of each of the constituent elements may be exaggerated for clarity and convenience of explanation. Also, the embodiments of the inventive concept are capable of various modifications and may be embodied in many different forms. It will also be understood that when an element is referred to as being "on" or "above" another element, the element may be in direct contact with the other element or other intervening elements may be present.

FIG. 1 is a schematic cross-sectional view of a structure of a semiconductor device 100 according to example embodiments.

Referring to FIG. 1, the semiconductor device 100 according to example embodiments includes a silicon semiconductor layer 101, metal material layers 106 and 107 that electrically contact the silicon semiconductor layer 101, and first and second self-assembled monolayers (SAMs) 104 and 105 between the silicon semiconductor layer 101 and the metal material layers 106 and 107.

The silicon semiconductor layer 101 may include source and drain regions 102 and 103 doped with a first conductive type dopant. A remaining region of the silicon semiconductor layer 101 besides the source and drain regions 102 and 103 may be doped with a second conductive type dopant that is electrically opposite to the first conductive type dopant. In FIG. 1, the source and drain regions 102 and 103 are depicted as being doped with an n-type dopant and the remaining region of the silicon semiconductor layer 101 is depicted as being doped with a p-type dopant, but this is solely an example. The source and drain regions 102 and 103 may be doped with a p-type dopant and the remaining region of the silicon semiconductor layer 101 may be doped with an n-type dopant. The source and drain regions 102 and 103 may be doped with a relatively high concentration of dopant of about equal to or greater than $10^{19}/cm^3$. The remaining region of the silicon semiconductor layer 101 may be doped with a relatively low concentration of dopant in a range from about $10^{14}$ to about $10^{18}/cm^3$.

According to example embodiments, the first and second SAMs 104 and 105 are arranged to form a molecular dipole on an interface of the silicon semiconductor layer 101 in a direction of reducing a Schottky barrier height (SBH). The first and second SAMs 104 and 105 may have a thickness of about 0.1 nm or greater and about 1 nm or less and may be uniformly coated on a surface of the silicon semiconductor layer 101.

The first and second SAMs 104 and 105 may form a positive molecular dipole or a negative molecular dipole on an interface of the silicon semiconductor layer 101. The first SAM 104 may be disposed on the source region 102 and the second SAM 105 may be disposed on the drain region 103.

When the source and drain regions 102 and 103 are doped with an n-type dopant, the first and second SAMs 104 and 105 may be arranged so that a positive molecular dipole is positioned at a side of the interface of the silicon semiconductor layer 101.

Also, when the source and drain regions 102 and 103 are doped with a p-type dopant, the first and second SAMs 104 and 105 may be arranged so that a negative molecular dipole is positioned at a side of the silicon semiconductor layer 101.

Figure 2:
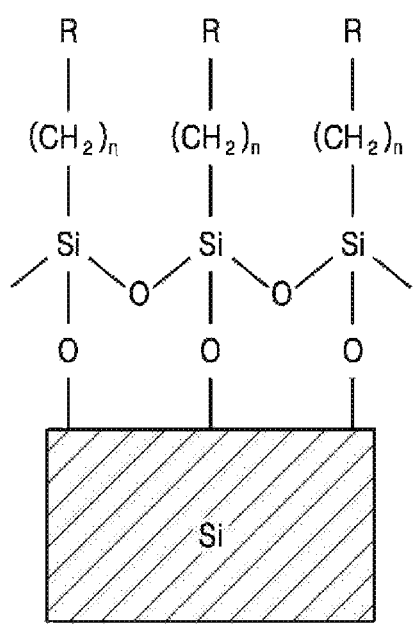
FIG. 2 shows an example of a silane structure that is applied as a self-assembled monolayer (SAM) to the semiconductor device of FIG. 1 and combines with silicon on an interface of a silicon semiconductor layer.

For example, the first and second SAMs 104 and 105 may include an SAM material that forms a silane structure shown below by combining with silicon as depicted in FIG. 2 on an interface of the silicon semiconductor layer 101.

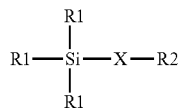

wherein,
each R1 includes one of $OCH_3$, $OC_2H_5$, and Cl,
R2 is a terminal group,
X is one of a benzene ring and $(CH_2)n$, and
n is equal to or greater than 1.

The SAM may have various dipole moments according to the type of head/tail group, and a dipole moment on an interface of a semiconductor device formed by the SAM may adjust an SBH of a metal-semiconductor junction according to the magnitude and direction of the dipole moment.

The magnitude and direction of the first and second SAMs 104 and 105 applied to the semiconductor device 100 may be determined according to the type of terminal.

The first and second SAMs 104 and 105 of FIG. 2 may form a positive molecular dipole or a negative molecular dipole on an interface of the silicon semiconductor layer 101 according to the type of terminals.

Figure 3:
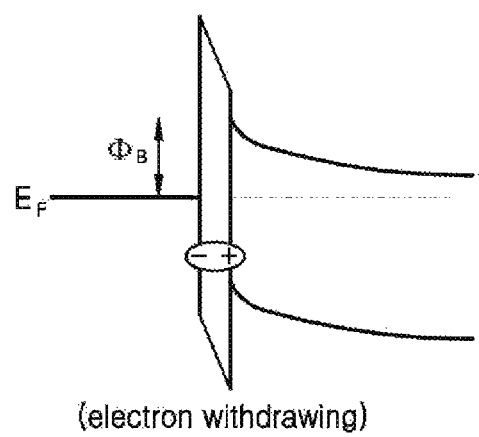
FIG. 3 is a schematic energy band diagram when a terminal group of an SAM material that constitutes the silane structure of FIG. 2 has an electron withdrawing characteristic.

FIG. 3 is a schematic energy band diagram when a terminal group of an SAM material that constitutes the silane structure of FIG. 2 has an electron withdrawing characteristic.

As depicted in FIG. 3, an SAM including a terminal group having an electron withdrawing characteristic may form a positive molecular dipole on a side of the interface of the silicon semiconductor layer 101. Accordingly, when the silicon semiconductor layer 101 is doped with an n-type dopant, the SBH may be reduced by forming the first and second SAMs 104 and 105 to have a positive molecular dipole. In FIG. 3, $E_F$ indicates Fermi level and $\Phi_B$ indicates SBH.

Figure 4:
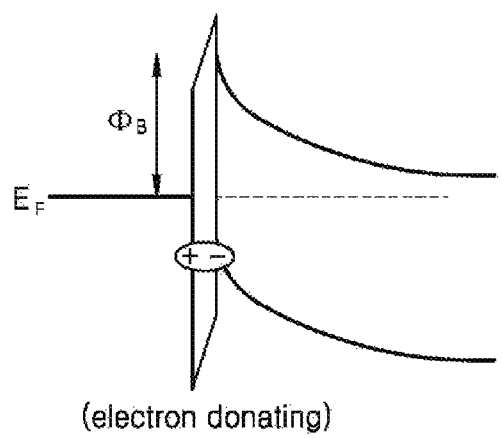
FIG. 4 is a schematic energy band diagram when a terminal group of an SAM material that constitutes the silane structure of FIG. 2 has an electron donating characteristic.

FIG. 4 is a schematic energy band diagram when a terminal group of an SAM material that constitutes the silane structure of FIG. 2 has an electron donating characteristic.

As depicted in FIG. 4, an SAM including a terminal group having an electron donating characteristic may form a negative molecular dipole on a side of the interface of the silicon semiconductor layer 101. Accordingly, for example, when the silicon semiconductor layer 101 is doped with a p-type dopant, the SBH may be reduced by forming the first and second SAMs 104 and 105 to have a negative molecular dipole. In FIG. 4, $E_F$ indicates Fermi level and $\Phi B$ indicates SBH.

Figure 5:
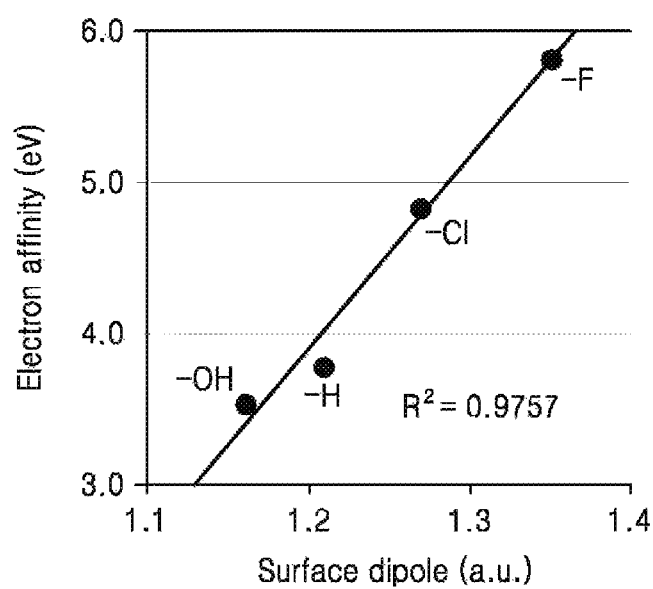
FIG. 5 is a graph showing a correlation between the size of a surface dipole formed on an interface of silicon and electron affinity.

FIG. 5 is a graph showing a correlation between the size of a surface dipole formed on an interface of silicon and electron affinity.

As shown in FIG. 5, the magnitude of a surface dipole formed on an interface of silicon may vary according to the type of terminal group of the SAM, and the electron affinity may increase in proportional to the magnitude of the surface dipole.

Figure 6A:
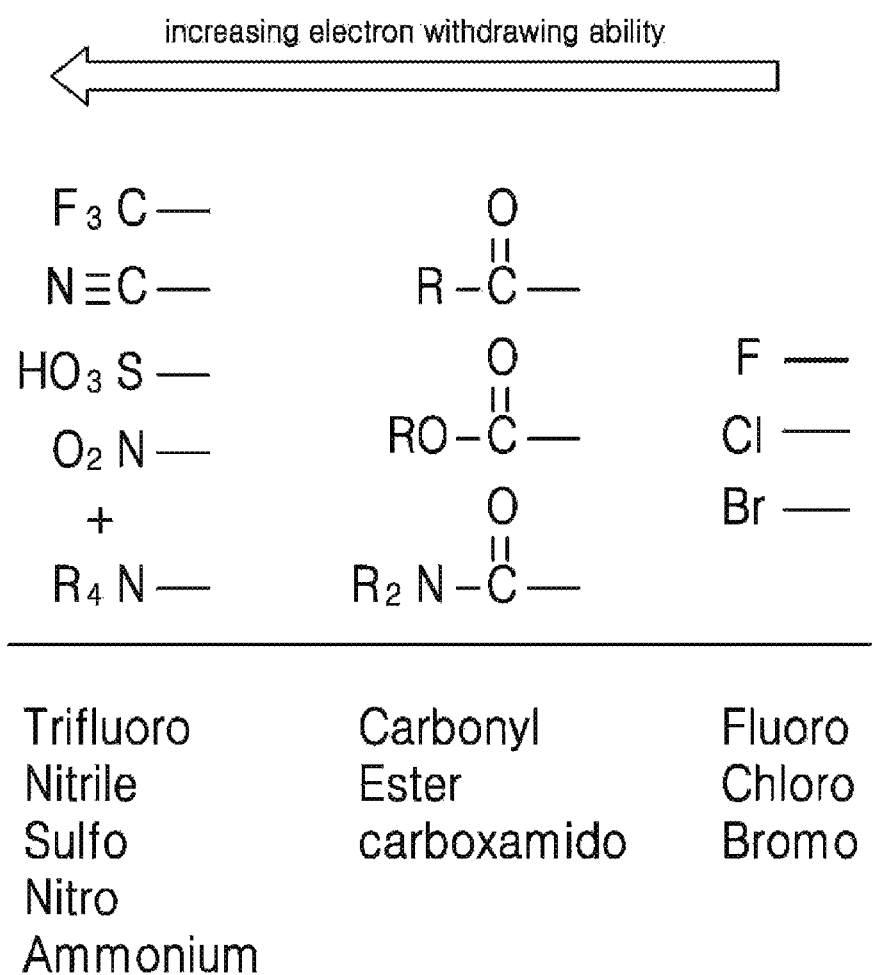
FIG. 6A shows various examples of terminal groups of SAM materials that make a combination of FIG. 2 by being applied to a self-assembled monolayer of a semiconductor device according to example embodiments and form a positive molecular dipole on an interface of a silicon semiconductor layer.

FIGS. 6A and 6B show various examples of the terminal groups of the SAM as depicted in FIG. 2 by being applied to the first and second SAMs 104 and 105 of the semiconductor device 100 according to example embodiments.

FIG. 6A shows various examples of terminal groups that form a positive molecular dipole on an interface of the silicon semiconductor layer 101.

The terminal groups that form a positive molecular dipole may have an electron withdrawing characteristic, and as shown by the arrow in FIG. 6A, the electron withdrawing ability is increased towards a left side from a right side of the arrow.

As depicted in FIG. 6A, terminal groups that form a positive molecular dipole may include trifluoro, nitrile, sulfo, nitro, ammonium, carbonyl, ester, carboxamido, fluoro, chloro, and bromo.

FIG. 6B shows various examples of terminal groups that form a negative molecular dipole on an interface of the silicon semiconductor layer 101.

The terminal groups that form a negative molecular dipole may have an electron donating characteristic, and as shown by the arrow in FIG. 6B, the electron donating ability is increased towards a right side from a left side of the arrow.

As depicted in FIG. 6B, terminal groups that form a negative molecular dipole may include primary amine, tertiary amine, hydroxyl, alkoxy, sulfhydryl, carboxamido, carboxyl, alkyl, aromatic (phenyl), and alkenyl.

For example, when a terminal group R2 is —CF$_3$ (trifluoro), the first and second SAMs 104 and 105 may include an SAM material having a structure as represented below:

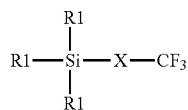

wherein, each R1 includes one of OCH$_3$, OC$_2$H$_5$, and Cl,

X is one of a benzene ring and (CH$_2$)n, and n is equal to or greater than 1.

As an example, when the terminal group R2 is —CF$_3$ (trifluoro), the first and second SAMs 104 and 105 may have a trimethoxy (3,3,3-trifluoropropy) silane structure as shown below:

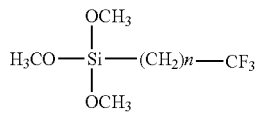

wherein, n may be equal to or greater than 1.

Figure 7:
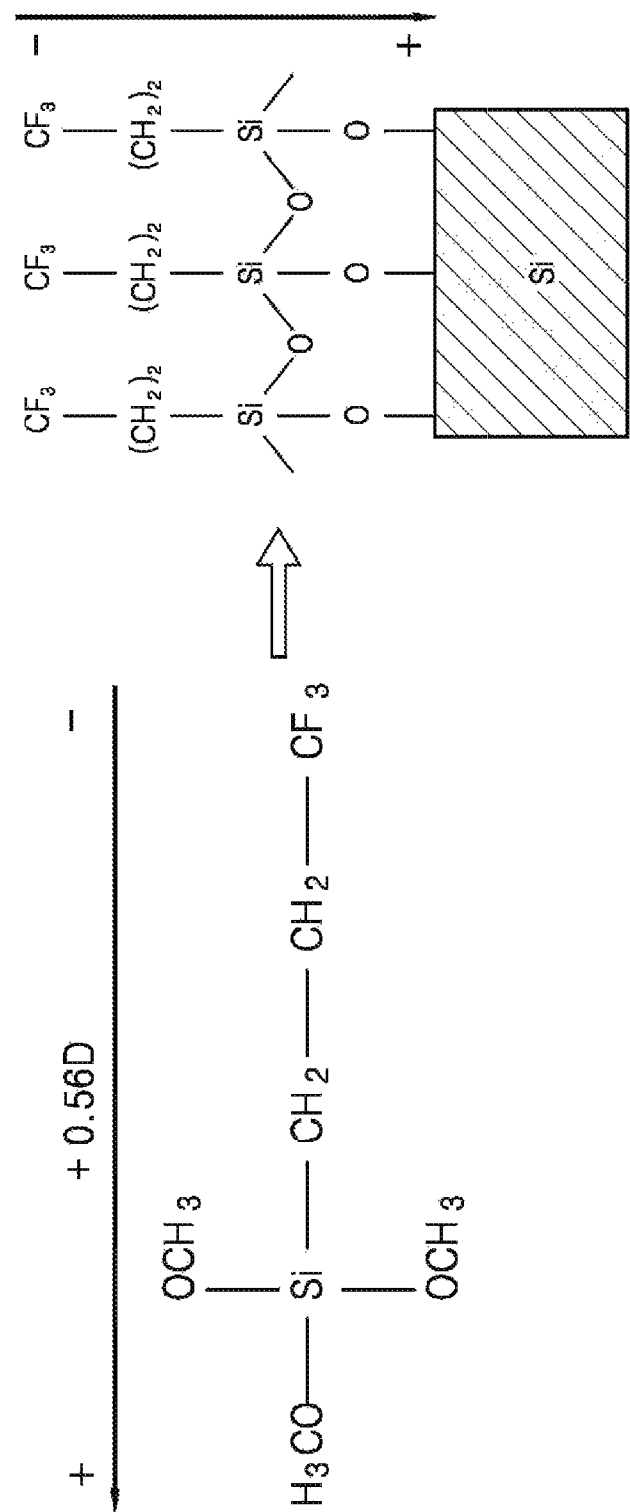
FIG. 7 shows an example of forming a positive molecular dipole on an interface of a silicon semiconductor layer with an SAM after forming the SAM by applying a terminal group of $—CF_3$.

When the first and second SAMs 104 and 105 are formed by applying the terminal group of —CF$_3$, as depicted in FIG. 7, the first and second SAMs 104 and 105 may form a positive molecular dipole on an interface of the silicon semiconductor layer 101.

The left side of FIG. 7 shows that the first and second SAMs 104 and 105 have a trimethoxy (3,3,3-trifluoropropy) silane structure when the terminal group R2 is —CF$_3$ (trifluoro), and thus, a positive molecular dipole is formed. The right side of FIG. 7 shows that the positive molecular dipole is formed on a side of the interface of the silicon semiconductor layer 101 by the trimethoxy (3,3,3-trifluoropropy) silane structure of the first and second SAMs 104 and 105. On the right side of FIG. 7, R2 is —CF$_3$ (trifluoro) and n is 2.

Figure 8:
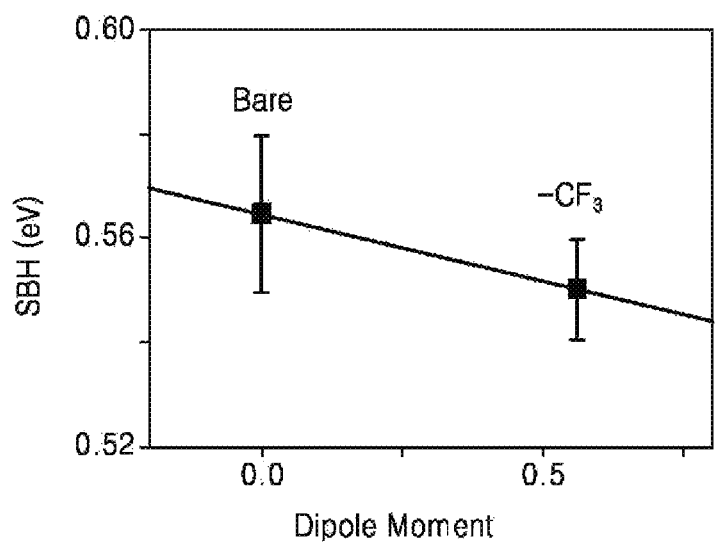
FIG. 8 is a graph showing measurement results of dipole moments and Schottky barrier heights (SBHs) between a sample in which an Au pad is formed on an SAM/Si stack layer that presents between a silicon semiconductor layer (Si) and a metal material (Au) and a sample (Bare) in which SAM is not present between the silicon semiconductor layer (Si) and the metal material (Au), wherein the SAM has a terminal group of $—CF_3$ and has a combination structure, as depicted in FIG. 2.

Accordingly, when the silicon semiconductor layer 101 is, for example, doped with an n-type dopant, as it is seen in FIG. 8, the SBH may be reduced by the positive molecular dipole formed on an interface of the silicon semiconductor layer 101 formed by the first and second SAMs 104 and 105. Accordingly, as it is seen in FIG. 9, a bias voltage at which current flows may be reduced.

Figure 9:
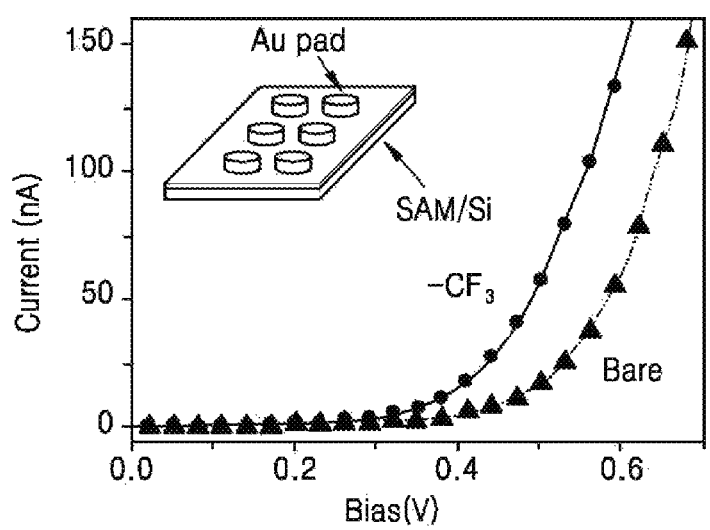
FIG. 9 is a graph showing measurement results of current variations according to a bias voltage between a sample in which an Au pad is formed on an SAM/Si stack layer that presents between a silicon semiconductor layer (Si) and a metal material (Au) and a sample (Bare) in which SAM is not present between the silicon semiconductor layer (Si) and the metal material (Au), wherein the SAM has a terminal group of $—CF_3$ and has a combination structure as depicted in FIG. 2.

In FIGS. 8 and 9, "Bare" indicates a case where the first and second SAMs 104 and 105 are not present between the silicon semiconductor layer 101 and the metal material layers 106 and 107, and "—CF$_3$" indicates a case that the first and second SAMs 104 and 105 having a terminal group of —CF$_3$ and a combination structure of FIG. 2 are present between the silicon semiconductor layer 101 and the metal material layers 106 and 107. FIGS. 8 and 9 show measurement results with respect to a sample in which an Au pad is formed as the metal material layers 106 and 107 on a stack structure of the silicon semiconductor layer 101 and the first and second SAMs 104 and 105, that is, an SAM/Si stack structure.

As described above, the SBH of a metal-semiconductor junction may be controlled according to the magnitude and direction of a molecular dipole formed on an interface of the silicon semiconductor layer 101 by the first and second SAMs 104 and 105.

Referring to FIG. 1, the metal material layers 106 and 107 may include a source electrode 106 on the first SAM 104 and a second drain electrode 107 on the second SAM 105, wherein the source electrode 106 and the drain electrode 107 are arranged respectively on the first and second SAMs 104 and 105 and are electrically connected to the silicon semiconductor layer 101.

The metal material layers 106 and 107 that include the source electrode 106 and the drain electrode 107 may include at least one of, for example, Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, and an alloy thereof.

The semiconductor device 100 may further include a gate insulating film 108, a gate electrode 109 disposed on the gate insulating film 108, and a spacer 110 that surrounds sidewalls of the gate insulating film 108 and the gate electrode 109. The gate insulating film 108 may be disposed on a surface of the silicon semiconductor layer 101 between the source region 102 and the drain region 103. The spacer 110 may reduce or prevent the gate insulating film 108 and the gate electrode 109 from directly contacting the source electrode 106 and the drain electrode 107. The gate insulating film 108 may include SiO$_2$, SiNx, HfO$_2$, or Al$_2$O$_3$, and the gate electrode 109 may include polysilicon or the same metal material used to form the metal material layers 106 and 107. The spacer 110 may include an insulating material, for example, SiO$_2$ or SiNx.

As described above, the semiconductor device 100 according to example embodiments may include an SAM between a silicon semiconductor layer and a metal material layer. In detail, the semiconductor device 100 may include the first SAM 104 between the source region 102 and the source electrode 106 and a second SAM 105 between the drain region 103 and the drain electrode 107. The first SAM 104 reduces the SBH by forming a molecular dipole on an interface of the source region 102 of the silicon semiconductor layer 101 and the second SAM 105 reduces the SBH by forming a molecular dipole on an interface of the drain region 103 of the silicon semiconductor layer 101. Thus, contact resistance between the source region 102 and the source electrode 106 and between the drain region 103 and the drain electrode 107 may be reduced.

Here, when the source region 102 and the drain region 103 are doped with an n-type dopant, the first and second SAMs 104 and 105 may be configured to form a positive molecular dipole, and when the source region 102 and the drain region 103 are doped with a p-type dopant, the first and second SAMs 104 and 105 may be configured to form a negative molecular dipole.

In FIG. 1, as an example, it is depicted that the source and drain regions 102 and 103 and an upper surface of the silicon semiconductor layer 101 on which the gate insulating film 108 is formed are the same height, and the first and second SAMs 104 and 105 extend to contact side surfaces of the spacer 110. The upper surface of the silicon semiconductor layer 101 on which the gate insulating film 108 is formed may be formed higher than the height of upper surfaces of the source and drain regions 102 and 103, and the height difference may be the same as the thicknesses of the first and second SAMs 104 and 105. In example embodiments, the first and second SAMs 104 and 105 may extend to an interface between the spacer 110 and the gate insulating film 108 along a lower surface of the spacer 110. Accordingly, a contact area of the source and drain regions 102 and 103 with the first and second SAMs 104 and 105 may be increased. Thus, the contact resistance may be additionally reduced.

The semiconductor device 100 described above is a unipolar metal oxide silicon field effect transistor (MOSFET) in which the source and drain regions 102 and 103 are doped to have a conductivity type opposite to that of remaining regions in the silicon semiconductor layer 101.

However, the principle of reducing the contact resistance by forming a positive molecular dipole or a negative molecular dipole to reduce the SBH on an interface of the silicon semiconductor layer by a SAM may be applied to all semiconductor devices having a hetero junction between a metal material and a silicon semiconductor layer as well as the unipolar MOSFET. For example, in the case that all regions of a silicon semiconductor layer are not doped or overall region of the silicon semiconductor layer is doped to have the same polarity, the contact resistance may be reduced by interposing an SAM that forms a positive molecular dipole or a negative molecular dipole in a direction of reducing an SBH between a silicon semiconductor and a metal material.

Figure 10:
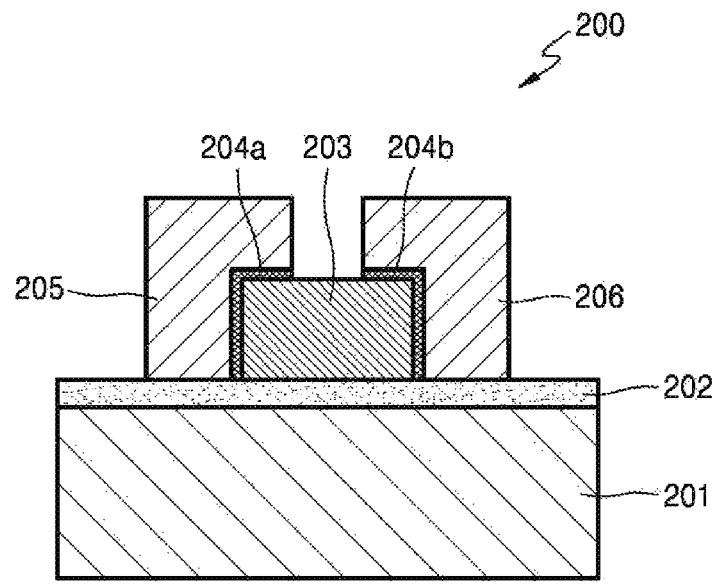
FIGS. 10 and 11 are schematic cross-sectional views of semiconductor devices according to example embodiments.

FIG. 10 is a schematic cross-sectional view of semiconductor device 200 according to example embodiments. Referring to FIG. 10, the semiconductor device 200 may include a gate electrode 201, a gate insulating film 202 on the gate electrode 201, a silicon semiconductor layer 203 on the gate insulating film 202, metal material layers 205 and 206 disposed on both sides of the silicon semiconductor layer 203 and electrically contact the silicon semiconductor layer 203, and SAMs 204a and 204b. The SAMs 204a and 204b are disposed between the silicon semiconductor layer 203 and the metal material layers 205 and 206. Here, the silicon semiconductor layer 203 may function as a channel layer.

The metal material layers 205 and 206 may include a source electrode 205 that is disposed on the gate insulating film 202 and faces a side surface of the silicon semiconductor layer 203 and a drain electrode 206 that is disposed on the gate insulating film 202 and faces the other side surface of the silicon semiconductor layer 203. Also, the gate electrode 201 may also include a metal material. The gate electrode 201, the source electrode 205, and the drain electrode 206 may also include the metal materials described above.

The SAMs 204a and 204b may include a first SAM 204a disposed between the source electrode 205 and a side surface of the silicon semiconductor layer 203 and a second SAM 204b disposed between the drain electrode 206 and the other side surface of the silicon semiconductor layer 203. As depicted in FIG. 10, the first SAM 204a may extend to a portion of an upper surface from a side surface of the silicon semiconductor layer 203. Also, the second SAM 204b may extend to a portion of an upper surface from the other side surface of the silicon semiconductor layer 203 not to contact the first SAM 204a. Accordingly, the SAMs 204a and 204b may bend with an angle of about 90 degrees between the side surfaces and the upper surface of the silicon semiconductor layer 203. The SAMs 204a and 204b may include SAM materials described above. The SAMs 204a and 204b may have a thickness of about 0.1 nm or greater and about 1 nm or less and may be uniformly coated on the surface of the silicon semiconductor layer 203.

Figure 11:
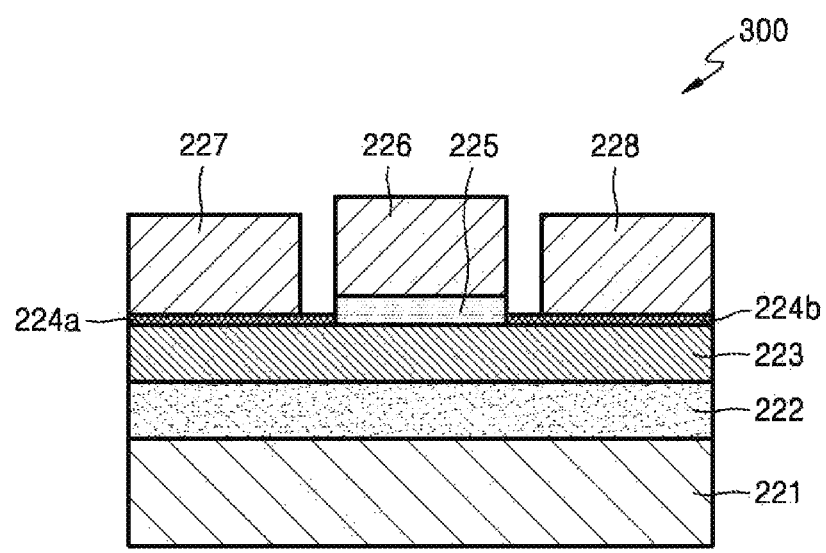

FIG. 11 is a cross-sectional view of a structure of a semiconductor device 300 according to example embodiments. The semiconductor device 200 of FIG. 10 has a bottom gate structure in which the gate electrode 201 is disposed below the silicon semiconductor layer 203. However, the semiconductor device 300 of FIG. 11 is different from the semiconductor device 200 of FIG. 10 in that the semiconductor device 300 has a top gate structure.

Referring to FIG. 11, the semiconductor device 300 may include a substrate 221, an insulating layer 222 on an upper surface of the substrate 221, a silicon semiconductor layer 223 on an upper surface of the insulating layer 222, a gate insulating film 225 on a region of an upper surface of the silicon semiconductor layer 223, a gate electrode 226 on an upper surface of the gate insulating film 225, SAMs 224a and 224b on a different region of the upper surface of the silicon semiconductor layer 223, and metal material layers 227 and 228 on an upper surface of the SAMs 224a and 224b. Here, the silicon semiconductor layer 223 may function as a channel layer.

The SAMs 224a and 224b may include a first SAM 224a and a second SAM 224b respectively disposed adjacent to both side surfaces of the gate insulating film 225 on the upper surface of the silicon semiconductor layer 223. For example, the gate insulating film 225 is disposed on a central region of the upper surface of the silicon semiconductor layer 223, and the first SAM 224a and the second SAM 224b may be disposed on the both sides of the gate insulating film 225. In FIG. 11, it is depicted as being the first and second SAMs 224a and 224b are completely contact the gate insulating film 225. However, the first and second SAMs 224a and 224b may be separated from the gate insulating film 225. In example embodiments, the upper surface of the silicon semiconductor layer 223 may be partly exposed between the gate insulating film 225 and the first and second SAMs 224a and 224b.

Also, the metal material layers 227 and 228 may include a source electrode 227 disposed on the first SAM 224a and a drain electrode 228 disposed on the second SAM 224b. Here, the materials for forming the metal material layers 227 and 228 and the SAMs 224a and 224b may be the same as the materials described with reference to FIG. 1. Also, the SAMs 224a and 224b may have thicknesses of about 0.1 nm or greater and about 1 nm or less and may be uniformly coated on the surface of the silicon semiconductor layer 223.

As depicted in FIG. 11, the source electrode 227 and the drain electrode 228 respectively may be partly disposed on the first and second SAMs 224a and 224b and may be separated from the gate insulating film 225. A portion of the upper surface of each of the first and second SAMs 224a and 224b may be exposed. However, the source electrode 227 and drain electrode 228 respectively may completely cover the entire surface of the first and second SAMs 224a and 224b.

A semiconductor device including a junction of metal material layers—SAMs—silicon semiconductor have been described with reference to accompanying drawings in which example embodiments are shown. However, it should be understood that example embodiments described herein should be considered in a descriptive sense only. Also, it should be understood that the scope of the inventive concepts is not limited to the example embodiments described above because various changes in form and details may be made by those of ordinary skill in the art.

A semiconductor device according to example embodiments includes SAMs between metal material layers and a silicon semiconductor layer to form a molecular dipole on an interface of a silicon semiconductor layer in a direction of reducing an SBH.

Accordingly, a semiconductor device having a metal-semiconductor junction configured to reduce contact resistance through the reduction in a Schottky energy barrier may be realized.

What is claimed is:

1. A semiconductor device comprising:
a silicon semiconductor layer including at least one region doped with a first conductive type dopant;
at least one metal material layer electrically connected to the doped region; and
at least one self-assembled monolayer (SAM) between the doped region and the metal material layer, the SAM forming a molecular dipole on an interface of the silicon semiconductor layer in a direction of reducing a Schottky barrier height (SBH), the SAM being formed by a self-assembled monolayer material having a structure as represented below,

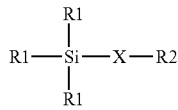

wherein,
each R1 includes one of $OCH_3$, $OC_2H_5$, and Cl,
R2 is a terminal group,
X is one of a benzene ring and $(CH_2)n$, and
n is equal to or greater than 1.

2. The semiconductor device of claim 1, wherein the SAM forms a positive molecular dipole or a negative molecular dipole on the interface of the silicon semiconductor layer.

3. The semiconductor device of claim 2, wherein
the at least one region doped is doped with an n-type dopant, and
the SAM forms the positive molecular dipole on a side of the interface of the silicon semiconductor layer.

4. The semiconductor device of claim 2, wherein
the at least one region doped is doped with a p-type dopant, and
the SAM forms the negative molecular dipole on a side of the interface of the silicon semiconductor layer.

5. The semiconductor device of claim 1, wherein the terminal group for R2 is a —$CF_3$ group.

6. The semiconductor device of claim 1, wherein
n is equal to or greater than 12.

7. The semiconductor device of claim 1, wherein
the at least one region doped is doped with an n-type dopant, and
the terminal group for R2 includes one of trifluoro, nitrile, sulfo, nitro, ammonium, carbonyl, ester, carboxamido, fluoro, chloro, and bromo.

8. The semiconductor device of claim 1, wherein
the at least one region doped is doped with a p-type dopant, and
the terminal group R2 includes one of primary amine, tertiary amine, hydroxyl, alkoxy, sulfhydryl, carboxamido, carboxyl, alkyl, phenyl, and alkenyl.

9. The semiconductor device of claim 1, wherein the SAM has a thickness of about 0.1 nm or greater and about 1 nm or less.

10. The semiconductor device of claim 1, wherein the at least one metal material layer includes at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, and an alloy thereof.

11. A semiconductor device comprising:
a silicon semiconductor layer including source and drain regions doped with a first conductive type dopant;
a metal material layer electrically connected to the source and drain regions, the metal material layer including a source electrode and a drain electrode; and
first and second self-assembled monolayers (SAMs) between the respective source and drain regions and the respective source and drain electrodes, the first and second SAMs forming a molecular dipole on an interface of the silicon semiconductor layer in a direction of reducing an Schottky barrier height (SBH)
the first and second SAMs being formed by a self-assembled monolayer material having a structure as represented below,

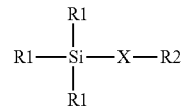

wherein,
each R1 includes one of $OCH_3$, $OC_2H_5$, and Cl,
R2 is a terminal group,
X is one of a benzene ring and $(CH_2)n$, and
n is equal to or greater than 1.

12. The semiconductor device of claim 11, wherein the first and second SAMs form a positive molecular dipole or a negative molecular dipole on the interface of the silicon semiconductor layer.

13. The semiconductor device of claim 12, wherein
the source and drain regions are doped with an n-type dopant, and
the first and second SAMs are on a side of the interface of the silicon semiconductor layer.

14. The semiconductor device of claim 12, wherein
the source and drain regions are doped with a p-type dopant, and
the first and second SAMs are on a side of the interface of the silicon semiconductor layer.

15. The semiconductor device of claim 11, wherein the terminal group for R2 is a —$CF_3$ group.

16. The semiconductor device of claim 11, wherein
n is equal to or greater than 12.

17. The semiconductor device of claim 16, wherein
the source and drain regions are doped with an n-type dopant, and
the terminal group R2 includes one of trifluoro, nitrile, sulfo, nitro, ammonium, carbonyl, ester, carboxamido, fluoro, chloro, and bromo.

18. The semiconductor device of claim 16, wherein
the source and drain regions are doped with a p-type dopant, and
the terminal group for R2 includes one of primary amine, tertiary amine, hydroxyl, alkoxy, sulfhydryl, carboxamido, carboxyl, alkyl, phenyl, and alkenyl.

19. The semiconductor device of claim 11, wherein the first and second SAMs have a thickness of about 0.1 nm or greater and about 1 nm or less.

20. The semiconductor device of claim 11, wherein the metal material layer includes at least one of Mg, Al, Sc, Ti, V, Cr, Mn, Ni, Cu, Zn, Ga, Zr, Nb, Mo, Pd, Ag, Cd, In, Sn, La, Hf, Ta, W, Ir, Pt, Au, Bi, and an alloy thereof.

* * * * *